(12) United States Patent
Hashigami

(10) Patent No.: US 12,428,725 B2
(45) Date of Patent: Sep. 30, 2025

(54) METHOD FOR FORMING FILM, FILM-FORMING APPARATUS, AND LAMINATE

(71) Applicant: SHIN-ETSU CHEMICAL CO., LTD., Tokyo (JP)

(72) Inventor: Hiroshi Hashigami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 38 days.

(21) Appl. No.: 18/277,096

(22) PCT Filed: Feb. 28, 2022

(86) PCT No.: PCT/JP2022/008173
§ 371 (c)(1),
(2) Date: Aug. 14, 2023

(87) PCT Pub. No.: WO2022/186112
PCT Pub. Date: Sep. 9, 2022

(65) Prior Publication Data
US 2024/0124973 A1 Apr. 18, 2024

(30) Foreign Application Priority Data
Mar. 2, 2021 (JP) .................. 2021-032594

(51) Int. Cl.
*C23C 16/448* (2006.01)
*C23C 16/40* (2006.01)
*C23C 16/455* (2006.01)

(52) U.S. Cl.
CPC .......... *C23C 16/4486* (2013.01); *C23C 16/40* (2013.01); *C23C 16/45504* (2013.01); *C23C 16/45591* (2013.01)

(58) Field of Classification Search
CPC ................ C23C 16/4486; C23C 16/40; C23C 16/45504; C23C 16/45591
See application file for complete search history.

(56) References Cited

U.S. PATENT DOCUMENTS

| | | | | |
|---|---|---|---|---|
| 7,038,217 B2 * | 5/2006 | Yamada | ............. | H01J 49/0445 250/288 |
| 9,017,481 B1 * | 4/2015 | Pettinger | ........... | H01J 37/32449 118/724 |

(Continued)

FOREIGN PATENT DOCUMENTS

| | | |
|---|---|---|
| CN | 103215567 A | 7/2013 |
| CN | 109414718 A | 3/2019 |

(Continued)

OTHER PUBLICATIONS

Jang, Moon-Hyung, et al., "Ultrasonic atomization of titanium isopropoxide at room temperature for TiO2 atomic layer deposition". J. Vac. Sci. Technol. A 38(6) Nov./Dec. 2020; 062405, pp. 1-6.*

(Continued)

*Primary Examiner* — Bret P Chen
(74) *Attorney, Agent, or Firm* — Oliff PLC

(57) ABSTRACT

A method for forming a film, including: forming a film on a base body; and discharging a gas with a discharging unit. A channel plate is above and opposite to the base body via a space. A mixed gas flow linearly flows from a mixed gas supplying unit toward the discharging unit so that the mixed gas through the space above the base body is along at least part of a main surface of the base body. A projection is formed on a part of: the channel plate and/or the stage to inhibit deviation of the mixed gas flow from a direction toward the discharging unit. The channel plate and projection are provided so that a gap having a width smaller than (Continued)

a shortest distance in the space between the channel plate and the base body is formed, and the film-formation and the discharging are performed.

12 Claims, 5 Drawing Sheets

(56) References Cited

U.S. PATENT DOCUMENTS

| | | | |
|---|---|---|---|
| 11,628,468 B2 | 4/2023 | Nishi | |
| 2008/0000842 A1* | 1/2008 | Matsuura | B01D 3/006 210/748.02 |
| 2008/0241363 A1* | 10/2008 | Tsukamoto | B41J 2/14233 204/192.18 |
| 2008/0274917 A1* | 11/2008 | Yu | B01J 19/0046 506/32 |
| 2011/0036403 A1* | 2/2011 | Yoon | H10K 30/50 257/E51.012 |
| 2011/0050636 A1* | 3/2011 | Nagata | G06F 3/0443 345/174 |
| 2011/0053234 A1* | 3/2011 | Matsuura | C12P 7/10 435/155 |
| 2013/0180452 A1 | 7/2013 | Kato et al. | |
| 2014/0231379 A1* | 8/2014 | Pitters | G01Q 70/16 216/11 |
| 2016/0060788 A1* | 3/2016 | Oda | C30B 29/02 117/64 |
| 2016/0222511 A1 | 8/2016 | Sasaki et al. | |
| 2018/0066361 A1* | 3/2018 | Nara | C23C 16/448 |
| 2018/0251898 A1 | 9/2018 | Yamaguchi et al. | |
| 2018/0326436 A1* | 11/2018 | Li | C23C 24/04 |
| 2018/0369861 A1* | 12/2018 | Katori | C23C 16/4481 |
| 2019/0210060 A1 | 7/2019 | Li | |
| 2020/0032390 A1 | 1/2020 | Kato | |
| 2020/0388491 A1 | 12/2020 | Nagaoka et al. | |
| 2021/0262087 A1* | 8/2021 | Lauffer | C23C 16/4586 |

FOREIGN PATENT DOCUMENTS

| | | | | |
|---|---|---|---|---|
| JP | 2012-62527 | * | 3/2012 | ............ C23C 18/12 |
| JP | 2014-063973 A | | 4/2014 | |
| JP | 2016-27635 A | | 2/2016 | |
| JP | 2016-79485 A | | 5/2016 | |
| JP | 2016-146442 A | | 8/2016 | |
| JP | 2016-155714 A | | 9/2016 | |
| JP | 2018-70437 | * | 5/2018 | ............ C30B 25/02 |
| JP | 2018-142637 A | | 9/2018 | |
| JP | 2020-98846 | * | 6/2020 | ........... H01L 21/368 |
| JP | 2020-198410 A | | 12/2020 | |
| KR | 20200012741 A | | 2/2020 | |
| WO | WO 2005/068682 A2 | * | 7/2005 | ........... C23C 16/448 |
| WO | 2020026823 A1 | | 2/2020 | |

OTHER PUBLICATIONS

Tadanaga, Kiyoharu, et al., "Preparation of LiMn2O4 cathode thin films for thin film lithium secondary batteries by a mist CVD process". Materials Research Bulletin, vol. 53, May 2014, pp. 196-198.*
Ganguly, Swapnodoot, et al., "Investigation on the Mist Intensity to Deposit Gallium Oxide Thin Films by Mist Chemical Vapor Deposition". Phys. Status Solidi RRL 2024, 18, 2300296, pp. 1-9.*
Yao, Suhao, et al., "Mist CVD technology for gallium oxide deposition: A review". Materials Today Physics 49 (2024) 101604, pp. 1-24.*
Eslamian, Morteza, "Inorganic and Organic Solution-Processed Thin Film Devices". Nano-Micro Lett (2017) 9:3, pp. 1-23.*
Arnou, Panagiota, et al., "Hydrazine-Free Solution-Deposited CuIn(S,Se)2 Solar Cells by Spray Deposition of Metal Chalcogenides". Applied Materials & Interfaces, 2016, 8, 11893-11897.*
Feb. 24, 2025 Extended Search Report issued in European Patent Application No. 22763168.6.
Oct. 15, 2024 Office Action issued in Japanese Patent Application No. 2023-503805.
Mar. 5, 2025 Office Action issued in Japanese Patent Application No. 2023-503805.
Apr. 26, 2022 International Search Report issued in International Patent Application No. PCT/JP2022/008173.
Aug. 29, 2023 International Preliminary Report on Patentability issued in International Patent Application No. PCT/JP2022/008173.
Jun. 30, 2025 Office Action and Search Report issued in Chinese Patent Application No. 202280016546.9.
Jul. 8, 2025 Decision of Refusal issued in Japanese Patent Application No. 2023-503805.
Jul. 21, 2025 Office Action and Search Report issued in Taiwanese Patent Application No. 111106116.

* cited by examiner

[FIG. 1]
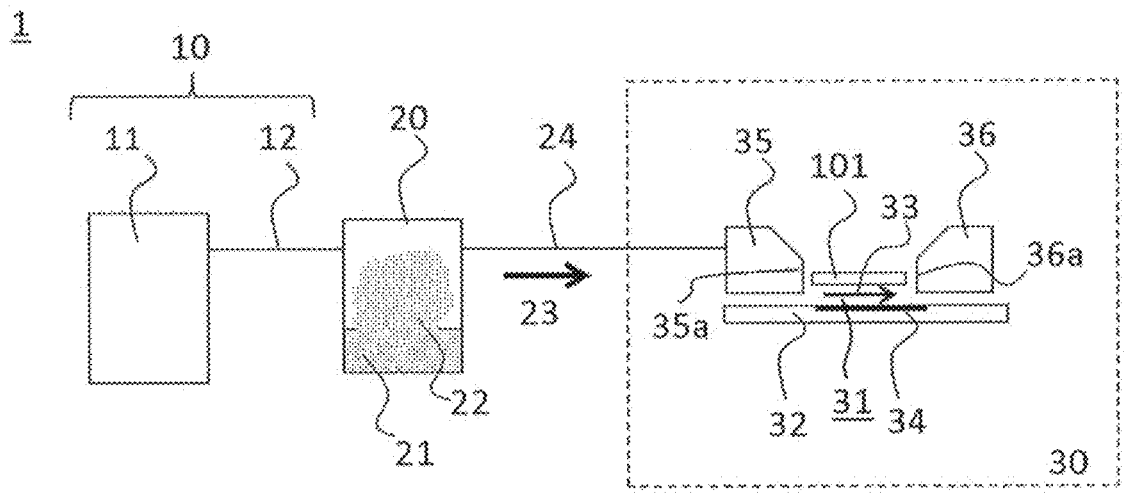
[FIG. 2]
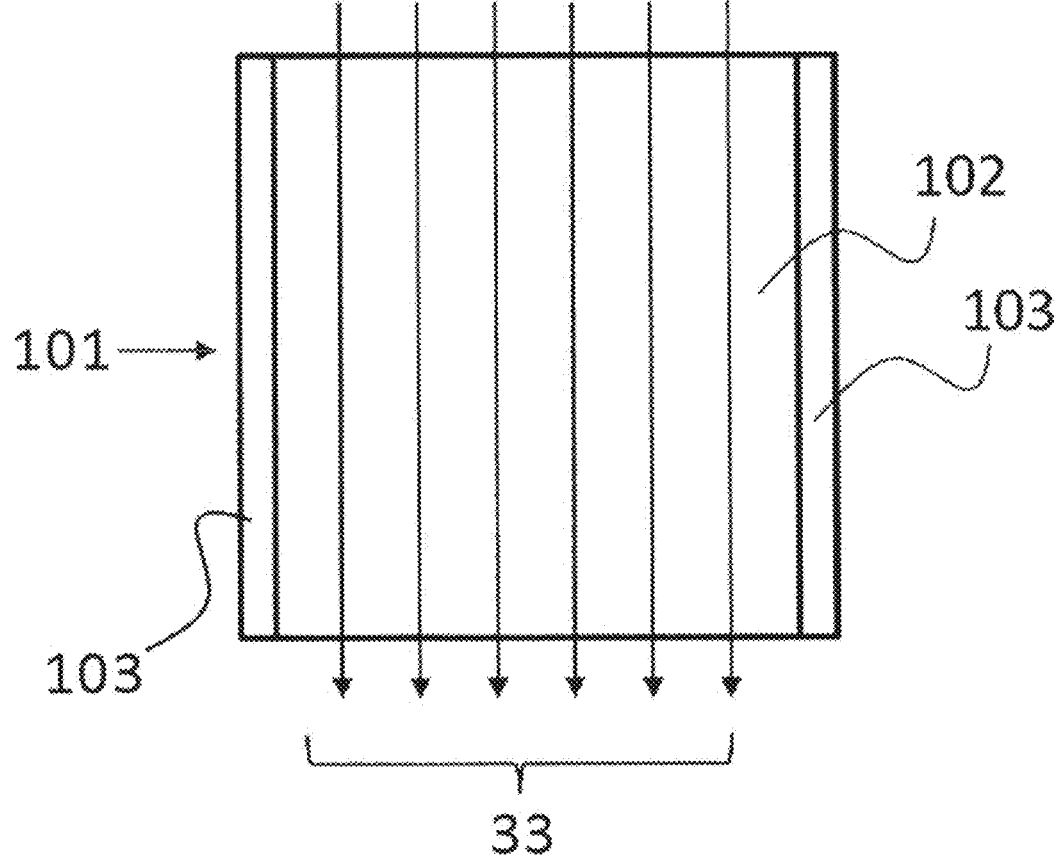

[FIG. 3]
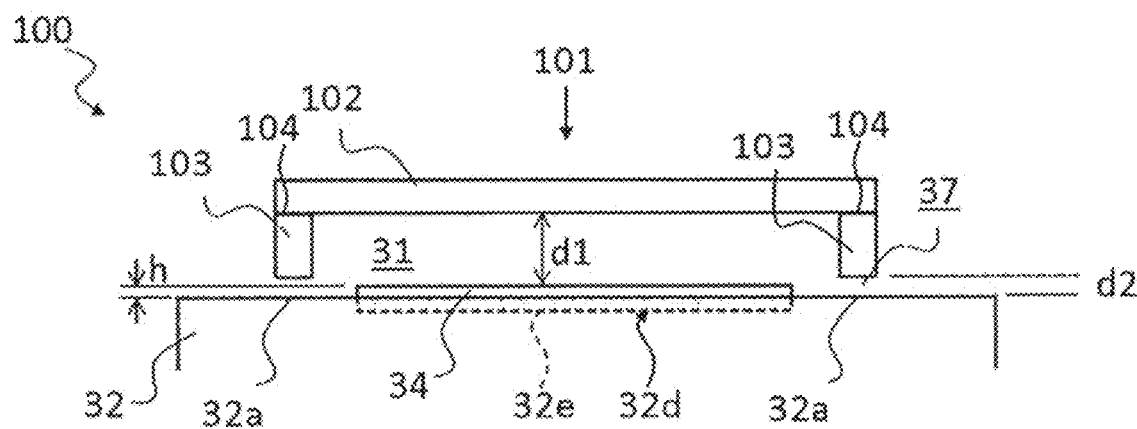
[FIG. 4]
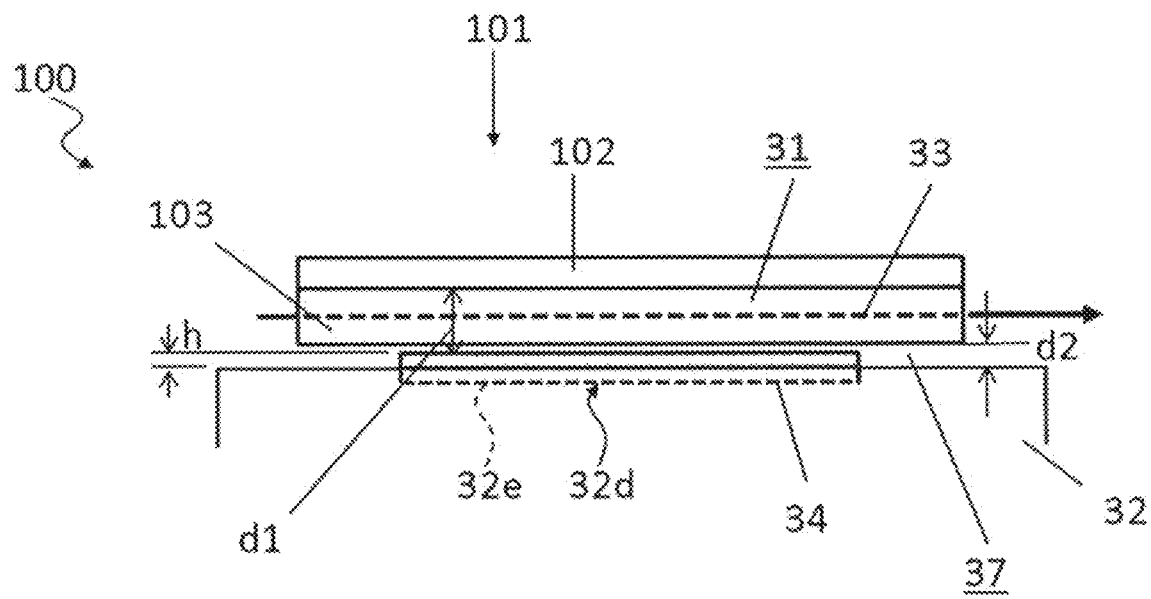

[FIG. 5]
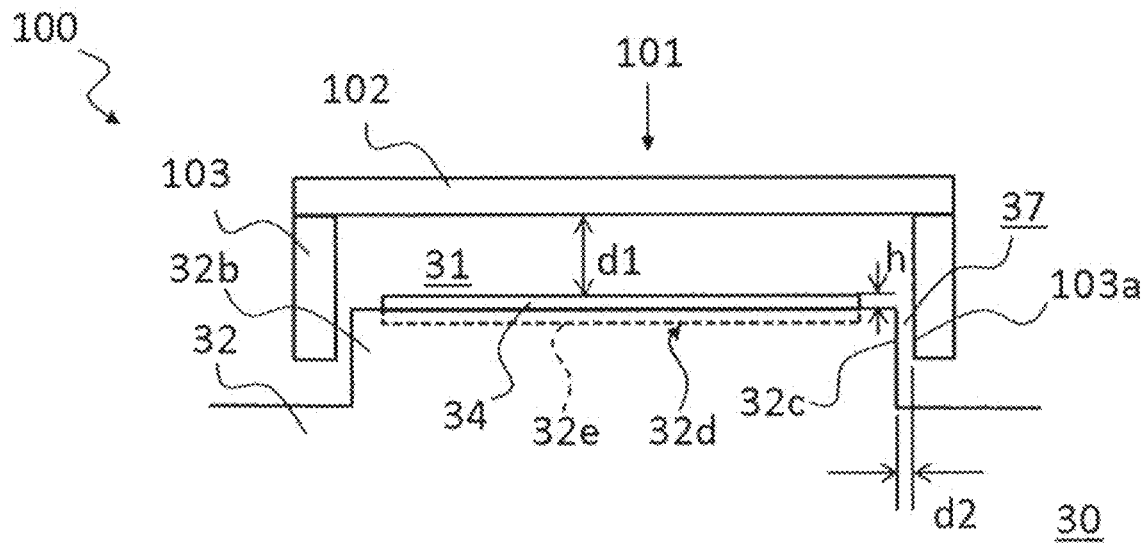
[FIG. 6]
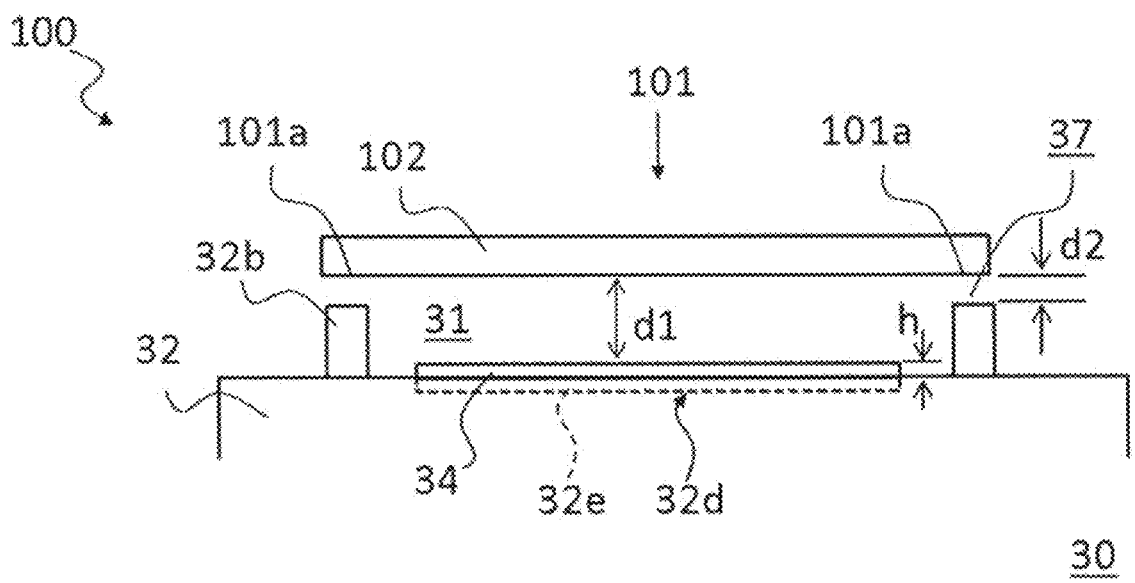

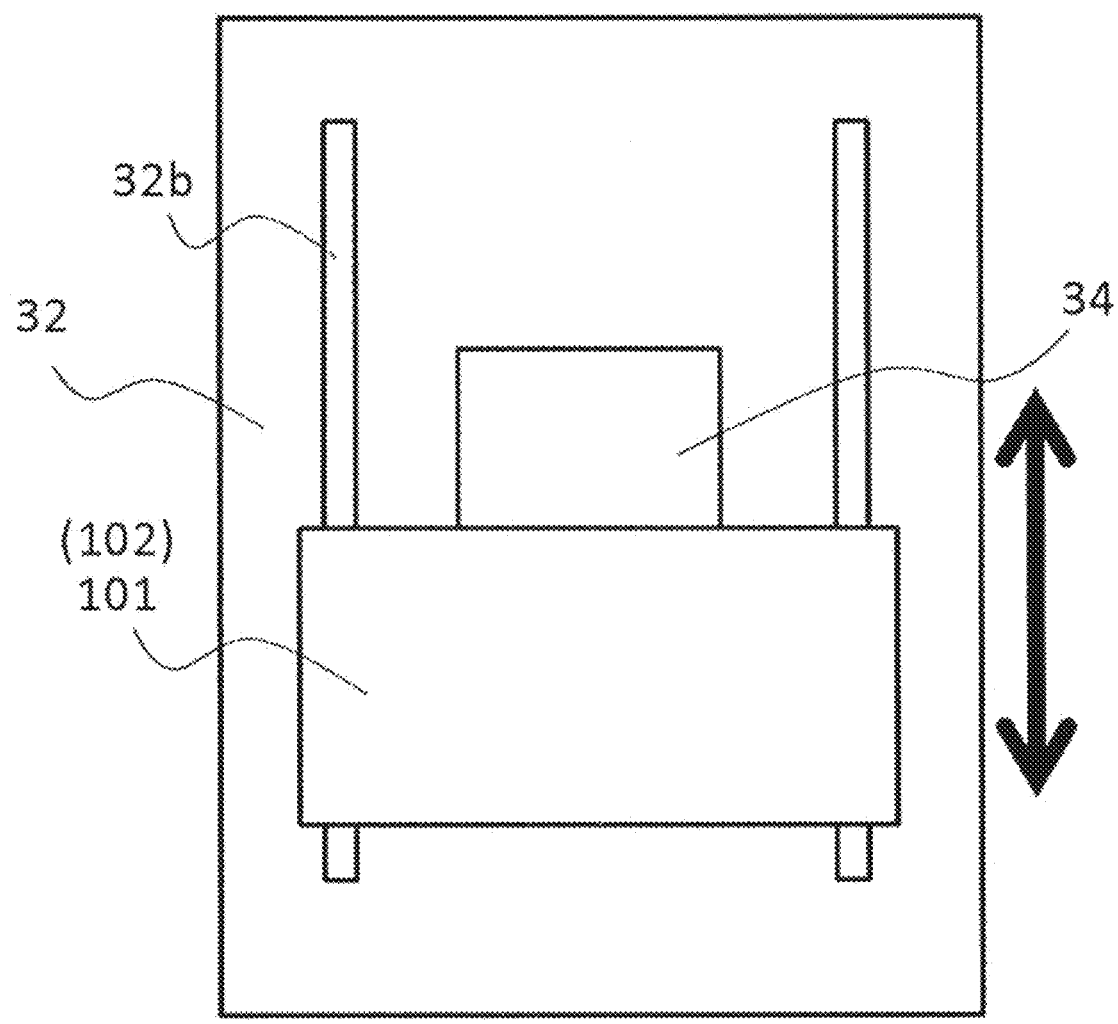
[FIG. 7]

[FIG. 8]
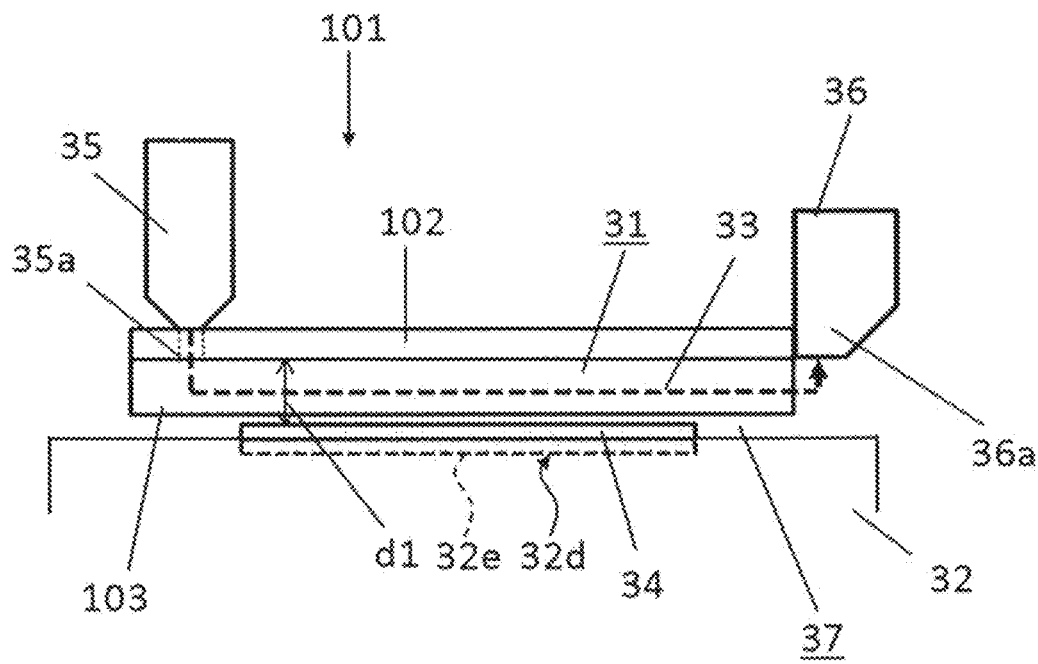
[FIG. 9]
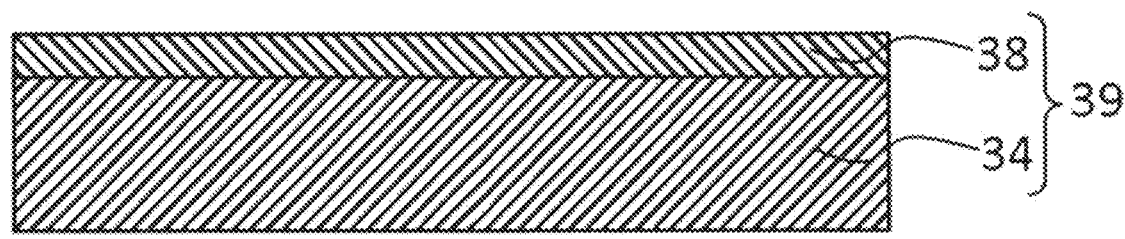

_US 12,428,725 B2_

METHOD FOR FORMING FILM, FILM-FORMING APPARATUS, AND LAMINATE

TECHNICAL FILED

The present invention relates to a method for forming a film by supplying an atomized liquid raw material to a base body, a film-forming apparatus, and a laminate.

BACKGROUND ART

Known as a method that can form an epitaxial film, etc. at a low temperature and at an atmospheric pressure is a film-forming technique using aqueous fine particles, such as a mist CVD method. Patent Document 1 describes a film-forming apparatus for forming a film by supplying a raw material mist to a base body through a nozzle provided with a tilt relative to the base body. Patent Document 2 describes a method for forming a film in which a raw material mist is carried into a reaction chamber with a carrier gas, and a spiral flow is generated to react the mist with a base body.

The conventional methods for forming a film, however, cannot sufficiently control the raw material mist on the base body, and consequently cause difficulty in film formation with a uniform thickness on base body having a large diameter which is practically size. There is also a problem of foreign matters, such as a powder generated by turbulence of the mist, adhering to the base body surface to decrease film quality and the yield.

CITATION LIST

Patent Literature

Patent Document 1: JP 2018-142637 A
Patent Document 2: JP 2016-146442 A

SUMMARY OF INVENTION

Technical Problem

The present invention has been made to solve the above problems. An object of the present invention is to provide: a method for forming a film that can manufacture a high-quality film with remarkably reduced surface defects and particle adhesion with high productivity; a film-forming apparatus that can manufacture a high-quality film with remarkably reduced surface defects and particle adhesion with high productivity; and a laminate having a main surface with few particles.

Solution to Problem

To solve the above problems, the present invention provides a method for forming a film, comprising steps of:
  atomizing a raw material solution to form a raw material mist;
  mixing the raw material mist and a carrier gas to form a mixed gas;
  placing a base body on a stage;
  supplying the mixed gas from a mixed gas supplying unit to the base body, and performing film-formation on the base body; and
  discharging a mixed gas after the film-formation by a discharging unit, wherein
  in the step of performing the film-forming on the base body and in the step of discharging by the discharging unit,
  a channel plate is provided above the base body so that the channel plate is opposite to the base body via a space,
  a mixed gas flow linearly flowing from the mixed gas supplying unit toward the discharging unit is formed so that the mixed etas through the space above the base body is along at least a part of a main surface of the base body,
  a projection is formed on a part of the channel plate and/or a part of the stage so as to inhibit deviation of the mixed gas flow from a direction from the mixed gas supplying unit toward the discharging unit, and
  the channel plate and the projection are provided so that a gap having a width $d2$ smaller than a shortest distance $d1$ in the space between the channel plate and the base body is formed, and the film-formation and the discharging are performed.

Such a method for forming a film inhibits particle adhesion, and enables to uniformly form a high-quality film on the base body surface.

In this case, the step of placing the base body on the stage is preferably performed so that a difference in height between an upper surface of the stage and an upper surface of the base body is 1 mm or less.

Such a method for forming a film can inhibit particle adhesion more easily.

In this case, the channel plate and the projection are preferably provided so that the shortest distance $d1$ is 1.5 times or more larger than the width $d2$.

Such a method for forming a film can form a film with higher quality.

In this case, the channel plate and the projection are preferably provided so that the shortest distance $d1$ is 2 times or more larger than the width $d2$.

Such a method for forming a film can stably form a film with further higher quality.

In this case, the projection is preferably formed on a part of the channel plate.

Such a method for forming a film can uniformly form a high-quality film more easily.

In this case, the projection is preferably formed on a party of the stage.

Such a method for forming a film can uniformly form a high-quality film more easily.

The present invention also provides a film-forming apparatus, comprising:
  an atomizer that atomizes a raw material solution to form a raw material mist;
  a supplying unit for a carrier gas which is to carry the raw material mist;
  a stage on which a base body is to be placed;
  a mixed gas supplying unit that supplies a mixed gas which is a mixture of the raw material mist and the carrier gas to a surface of the base body;
  a channel plate provided above the base body so that the channel plate is opposite to the base body via a space;
  a discharging unit that discharges the mixed gas in the space; and
  a projection formed on a part of the channel plate and/or a part of the stage so as to inhibit deviation of a flow of the mixed gas from a direction from the mixed gas supplying unit toward the discharging unit, wherein the channel plate and the projection are provided so that a gap having a width d2 smaller than a shortest distance d1 in the space between the channel plate and the base body is formed.

Such a film-forming apparatus cart inhibit particle adhesion, and can uniformly form a high-quality film on the base body surface.

The stage can have a spot facing for receiving the base body with a portion on which the base body is to be placed.

Providing such a spot facing can regulate a difference (difference in height) between an upper surface of the stage and an upper surface of the base body to sufficiently inhibit generation of turbulence due to a step between the stage and the base body, and to inhibit generation of particles and sufficiently inhibit generation of distribution of the mist to prevent an increase in distribution of the film thickness.

The channel plate and the projection are preferably provided so that the shortest distance d1 is 1.5 times or more larger than the width d2.

Such a film-forming apparatus can form a film with higher quality.

The channel plate and the projection are more preferably provided so that the shortest distance d1 is 2 times or more larger than the width d2.

Such a film-forming apparatus can more stably form a film with further higher quality.

The projection is preferably formed on a part of the channel plate.

Such a film-forming apparatus can uniformly form a high-quality film more easily.

The projection is preferably formed on a part of the stage.

Such a film-forming apparatus can uniformly form a high-quality film more easily.

The present invention also provides a laminate, comprising:
  a base body; and
  an $\alpha$-$Ga_2O_3$ film directly or indirectly laminated on or above the base body,
  wherein a density of particles with 0.5 μm or more in diameter on a main surface of the laminate is 9 or less per 10 $cm^2$.

Such a laminate can have a high-quality $\alpha x$-$Ga_2O_3$ film with reduced particle adhesion.

The main surface of the base body can have an area of 5 $cm^2$ or more.

The present invention can have a high-quality $\alpha$-$Ga_2O_3$ film with reduced particle adhesion even when an area of the main surface of the base body is 5 $cm^2$ or more.

Advantageous Effects of Invention

As noted above, the inventive method for forming a film can manufacture a high-quality film, for example a thin film, with remarkably reduced surface defects and adhesion of foreign matters, such as particles, with high productivity.

The inventive film-forming apparatus can manufacture a high-quality film, for example a thin film, with remarkably reduced surface defects and adhesion of foreign matters, such as particles, with high productivity.

The inventive laminate can have a high-quality $\alpha$-$Ga_2O_3$ film with reduced particle adhesion.

BRIEF DESCRIPTION OF DRAWINGS

FIG. 1 is a schematic view illustrating a representative example of a film-forming apparatus that cart be used for a method for forming a film according to the present invention.

FIG. 2 is a view illustrating a bottom of a representative embodiment of a channel plate that can be used for a method for forming a film according to the present invention.

FIG. 3 is a schematic side view illustrating a representative embodiment of arrangement of a channel plate, a projection, and a stage that is performed in a method for forming a film according to the present invention.

FIG. 4 is another side view of the arrangement illustrated in FIG. 3.

FIG. 5 is a schematic side view illustrating another example of arrangement of a channel plate, a projection, and a stage that is performed in a method for forming a film according to the present invention.

FIG. 6 is a schematic side view illustrating another example of arrangement: of a channel plate, a projection, and a stage that is performed in a method for forming a film according to the present invention.

FIG. 7 is a plane view of the embodiment in FIG. 6 viewed from a vertically upward direction.

FIG. 8 is a schematic side view illustrating another embodiment of a film-forming unit: in an example used for a of a film-forming apparatus that can be film-forming apparatus according to the present invention.

FIG. 9 is a schematic cross-sectional view of an example of the inventive laminate.

DESCRIPTION OF EMBODIMENTS

As noted above, there have been demands for development of a method for forming a film that can manufacture a high-quality film with remarkably reduced surface defects and adhesion of foreign matters with high productivity.

The present inventors have made earnest: study on the above problems, and consequently found that the turbulence of the mixed gas flow can be inhibited and the high-quality film with remarkably reduced surface defects and adhesion of foreign matters can be manufactured with high productivity by a method for forming a film and a film-forming apparatus with a mist CVO method including: providing a channel plate above a base body so that the channel plate is opposite to the base body via a space; forming a mixed gas flow linearly flowing from a mixed gas supplying unit toward a discharging unit so that the mixed gas through the space above the base body is along at least a part of a main surface of the base body; forming a projection on a part of the channel plate and/or a part of a stage so as to inhibit deviation of the mixed gas flow from a direction from the mixed gas supplying unit toward the discharging unit; providing the channel plate and the projection so that a gap having a width d2 smaller than a shortest distance d1 in the space between the channel plate and the base body is formed, and performing the film-formation and the discharging. This finding has led to complete the present invention.

Specifically, the present invention is a method for forming a film, comprising steps of:
  atomizing a r a w material solution to form a r a w material mist;
  mixing the raw material mist and a carrier gas to form a mixed gas;
  placing a base body on a stage;
  supplying the mixed gas from a mixed gas supplying unit to the base body, and performing film-formation on the base body; and
  discharging a mixed gas after the film-formation by a discharging unit, wherein in the step of performing the film-forming on the base body and in the step of discharging by the discharging unit, a channel plate is provided above the base body so that the channel plate is opposite to the base body via a space, a mixed gas flow linearly flowing from the mixed gas supplying unit toward the discharging unit is formed so that the mixed gas through the space above the base body is along at least a part of a main surface of the base body, a projection is formed on a part of the channel plate and/or a part of the stage so as to inhibit deviation of the mixed gas flow from a direction from the mixed gas supplying unit toward the discharging unit, and the channel plate and the projection are provided so that a gap having a width d2 smaller than a shortest distance d1 in the space between the channel plate and the base body is formed, and the film-formation and the discharging are performed.

In addition, the present, invention is a film-forming apparatus, comprising:

an atomizer that atomizes a raw material solution to form a raw material mist;

a supplying unit for a carrier gas which is to carry the raw material mist;

a stage on which a base body is to be placed;

a mixed gas supplying unit that supplies a mixed gas which is a mixture of the raw material mist and the carrier gas to a surface of the base body;

a channel plate provided above the base body so that the channel is opposite to the base body via a space;

a discharging unit that discharges the mixed gas in the space; and a projection formed on a part of the channel plate and/or a part of the stage so as to inhibit deviation of a flow of the mixed gas from a direction from the mixed gas supplying unit: toward the discharging unit, wherein the channel plate and the projection are provided so that a gap having a width d2 smaller than a shortest distance d1 in the space between the channel plate and the base body is formed.

In addition, the present invention is a laminate, comprising:

a base body; and an $\alpha\text{-}Ga_2O_3$ film directly or indirectly laminated on or above the base body, wherein a density of particles with 0.5 μm or more in diameter on a main surface of the laminate is 9 or less per 10 cm$^2$.

Hereinafter, the present invention will be described in detail with reference to the drawings, but the present invention is not limited thereto.

[Method for Forming Film]

First, an example of a film-forming apparatus that can be used for a method for forming a film according to the present invention will be described.

FIG. 1 illustrates a representative example of the film-forming apparatus that can be used for the method for forming a film according to the present invention film-forming. The apparatus that can perform the method for forming a film according to the present invention is not limited to the film-forming apparatus illustrated in FIG. 1.

A film-forming apparatus 1 illustrated in FIG. 1 includes a carrier gas 11, a carrier gas pipe 12, an atomizer 20, a mist pipe 24, a mixed gas supplying unit 35, a stage 32, a straightening plate 101, and a discharging unit 36, and a base body 34 on which a film is to be formed is placed on the stage 32 (a step of placing the base body on the stage). The carrier gas 11 and the carrier gas pipe 12 constitute a carrier gas supplying unit 10. The straightening plate 101 and the stage 32 constitute a straightening mechanism, described later. The mixed gas supplying unit 35, the stage 32, the straightening plate 101, the discharging unit 36, and the stage 32 constitute a film-forming unit 30. Note that, the sign 35a represents an ejecting port, and the sign 36a represents a discharging port.

In the atomizer 20, a raw material solution 21 is stored as a raw material. The raw material solution 21 is not particularly limited as long as it can be atomized (also referred to as "atomized into a mist"), and a solution in an organic solvent, such as alcohols and ketones, and aqueous solution that contain a raw material corresponding to a purpose can be applied.

The raw material solution 21 is atomized by using a known means to form a raw material mist 22. This atomization is an example of the step of forming the raw material mist in the method for forming a film according to the present invention.

The carrier gas 11 is further supplied to the atomizer 20, and mixed with the raw material mist 22 to form a mixed gas 23. This is an example of the step of forming a mixed gas in the method for forming a film according to the present invention it can be mentioned that the carrier gas supplying unit 10 and the atomizer 20 constitute a mechanism 40 for forming the mixed gas 23. The mixed gas 23 is carried through the mist pipe 24 to be supplied to the mixed gas supplying unit 35.

The mixed gas 33 is supplied from the mixed gas supplying unit 35 to a space 31 in the straightening mechanism formed between the straightening plate 101 and the stage 32, and supplied to the base body 34, specifically a surface of the base body 34, placed on the stage 32 while being subjected to the straightening in the straightening mechanism. In this process, the mixed gas 33 and the base body 34 are reacted to form a film on the base body 34. This is an example of the step of performing the film-formation on the base body in the method for forming a film according to the present invention.

An excess mixed gas 33 that has not contributed to the film formation and byproducts generated in the reaction between the mixed gas 33 and the base body 34 are sucked by the discharging unit 36 as a mixed gas after the film-formation to be discharged to an outside of the system. This is an example of the step of discharging by the discharging unit in the method for forming a film according to the present invention. The discharged gas from the discharging unit 36 may be treated with a particle collector or a scrubber, not illustrated, as necessary.

The atomization of the raw material solution 21 is not particularly limited as long as the raw material solution 21 can be atomized or formed into a droplet, and may be a known means. In the present invention, an atomizer using ultrasonic wave is preferable. A mist or droplet obtained by using ultrasonic is preferable because it has an initial velocity of zero, and it floats in air. For example, such a mist is extremely preferable because it can be carried as a gas floating in a space, not spraying as a spray, without damage due to collision energy. The droplet size is not particularly limited and may be around several mm, but preferably 50 μm or less, and more preferably 0.1 to 10 μm.

The carrier gas 11 is not particularly limited, and for example, air, oxygen, ozone, an inert gas such as nitrogen and argon, and a reducing gas such as hydrogen and a forming gas are preferably used. A number of kinds of the carrier gas 11 may be one, or two or more. A flowrate of the carrier gas is appropriately set depending on a size of the base body or a size of the film-forming chamber, and can be approximately 0.01 to 100 L/min, for example.

Although not illustrated, a dilution gas can be further added to regulate a ratio between the raw material, mist 22 and the carrier gas 11. A flowrate of the dilution gas is appropriately set, and can be 0.1 to 10 times/min of the flowrate of the carrier gas, for example. The dilution gas is supplied on a downstream side of the atomizer 20, for example. The dilution gas to the used may be same as or different from the carrier gas 11.

The film-formation can be performed under any conditions of an atmospheric pressure, an increased pressure, and a reduced pressure, but preferably performed under an atmospheric pressure in terms of an apparatus cost and productivity.

Should be noted that although FIG. 1 illustrates an embodiment using one atomizer, the film-forming apparatus that can be used in the inventive method for forming a film is not limited thereto, and a plurality of atomizers can be connected in series or parallel to use. In this case, into each atomizer, different raw material solutions may be fed to use, or a same raw material solution may be fed to use. Each raw material may be separately atomized and independently supplied to the mixed gas supplying unit 35, or a plurality of types of the raw material mist may be mixed and then supplied to the mixed gas supplying unit 35.

The mist pipe 24 is not particularly limited as long as it has sufficient stability against the used raw material solution 21, an operation temperature of the mixed gas supplying unit 35 and the carrier gas pipe 12, etc., and may be a pipe made of resin, metal, glass, or combination thereof according to the purpose.

An embodiment and supplying type of the mixed gas supplying unit 35 are not particularly limited, and known mixed gas supplying unit can be widely applied. A shape of the ejecting port 35a is not particularly limited, but preferably a slit, shape in order to form a more uniform laminar flow of the mixed gas 33. In this case, a length of the ejecting port 35a in a longitudinal direction can be a sufficient length for a shape of the base body.

The mixed gas supplying unit 35 is not particularly limited as long as it has sufficient stability against the used raw material solution 21 and use temperature, and the material may be resin, metal, glass, or combination thereof according to the purpose.

An embodiment of the discharging unit 36 is not particularly limited and known discharging units are widely applied, but the discharging port 36a preferably has an aperture having a length equal to or longer than length of the straightening plate 101 in a longitudinal direction. This can more favorably retain the flow of the mixed gas 33. The discharging unit 36 is not particularly limited as long as it has sufficient stability against the used raw material solution 21 and use temperature, and the material may be resin, metal, glass, or combination thereof according to the purpose.

A discharging rate of the discharging unit 36 may be appropriately regulated according to the film-forming condition, but preferably approximately 70 to 150%, and more preferably approximately 80 to 1.30%, relative to the flowrate of the mixed gas 33 in order to retain the laminar flow of the mixed gas 33. As is obvious from an example of the straightening mechanism according to the present invention, described later, when the discharging rate is smaller than the flowrate of the mixed gas, the mixed gas is discharged on the discharging unit side as it is. When the discharging rate is larger than the flowrate of the mixed gas, differential air flows from the mixed gas supplying unit: side together with the mixed gas. In both the cases, the flow of the mixed gas 33 flowing in the space 31 is retained without turbulence.

Should be noted that although FIG. 1 illustrates the embodiment in which the mixed gas 33 is ejected in the horizontal direction through the ejecting port 35a provided in the horizontal direction and discharged through the discharging 36a provided in the horizontal direction, the film-forming apparatus that can be used in the inventive method for forming a film is not limited thereto. The ejecting port 35a and the discharging port 36a may be provided so that the ejecting direction and/or the discharging direction make any angle relative to the stage 32, from the horizontal direction to the vertical direction.

Arrangement Example

Next, several arrangement examples in the step of performing the film-formation on the base body and the step of discharging by the discharging unit in the method for forming a film according to the present invention will be described with reference to FIG. 1 to FIG. 6.

First, the channel plate is provided above the base body 34 so as to be opposite to the base body 34 via the space 31. As the channel plate, a channel plate 102 being a part of the straightening plate 101, representatively illustrated in FIG. 2, can be used for example.

In the step of performing the film-formation on the base body and in the step of discharging by the discharging unit, as illustrated in FIG. 1, a mixed gas flow 33 linearly flowing from the mixed gas supplying unit 35 toward the discharging unit 36 is formed so that the mixed gas 33 through the space 31 above the base body 34 is along at least a part of a main surface of the base body 34.

Furthermore, a projection 103 is formed on a part of the channel plate 102 and/or a part of the stage 32 so as to inhibit deviation of the mixed gas flow 33 from a direction from the mixed gas supplying unit 35 toward the discharging unit 36.

FIG. 2 illustrates a representative embodiment: of the straightening plate including the channel plate, and the straightening mechanism including this straightening plate. A straightening mechanism 100 illustrated in FIG. 2 includes the straightening plate 101 constituted with the channel plate 102 and the projections 103. The projections 103 are provided on edges of the channel plate 102 in parallel with each other, and the mixed gas 33 of the raw material mist and the carrier gas flows in a region sandwiched between the projections 103 toward the longitudinal direction of the projection 103.

As described later in detail with examples with reference to FIGS. 3 and 4, the channel plate 102 and the projections 103 included in this straightening mechanism 100 are provided so as to form a gap having a width d2 smaller than a shortest distance d1 in the space 31 between the channel plate 102 and the base body 34, and the film-formation and the discharging are performed.

Performing the film-formation and the discharging with such arrangement can inhibit turbulence of the flow of the mixed gas 33, which can manufacture a high-quality film with remarkably reduced surface defects and adhesion of foreign matters with high productivity.

A shape of the channel plate is not particularly limited, and a main surface thereof can have any of a circular, oval, or another shape. The bottom of the channel plate 102 may be any as long as it is flat, and may be a smooth surface or may be a processed surface, such as sand-blasted in order to prevent adhesion of a powder, according to the purpose and use.

A shape of the projection 103 is not, particularly limited, and a cross section thereof can have any of a rectangular, circular, oval, or another shape. The projection 103 may be any as long as it has sufficient stability according to properties of the used raw material and the temperature condition. In this case, metals such as aluminum or stainless steel may be used. When the film-formation is performed at a high temperature exceeding a heat-resistant temperature of these metals or when an acidic or alkaline raw material is used, alloys such as Hastelloy, soda-lime glass, borosilicate glass, quartz, silicon carbide, or ceramics such as silicon nitride and aluminum nitride may be used.

Structures, etc. of the straightening mechanism 100 other than the above position are not particularly limited, and may be any as long as they have sufficient stability according to properties of the used raw material and the temperature condition. In this case, metals such as aluminum or stainless steel may be used. When the film-formation is performed at a high temperature exceeding a heat-resistant temperature of these metals or when an acidic or alkaline raw material is used, alloys such as Hastelloy, soda-lime glass, borosilicate glass, quartz, silicon carbide, or ceramics such as silicon nitride and aluminum nitride may be used.

FIG. 3 is a schematic side view illustrating a representative embodiment of arrangement of the channel plate, the projections, and the stage that is performed in the method for forming a film according to the present: invention when the straightening plate 101 illustrated in FIG. 2 is used. FIG. 4 is another side view of the arrangement illustrated in FIG. 3.

FIG. 3 is a view describing an example of arrangement in the film-forming unit 30 illustrated in FIG. 1, and is a side view of the straightening mechanism 100 in the flowing direction of the mixed gas 33. FIG. 4 is another side view of the straightening mechanism 100 illustrated in FIG. 3, and is a side view of the straightening mechanism 100 in a vertical direction relative to the flux of the mixed gas 33.

The straightening plate 101 illustrated in FIG. 3 and FIG. 4 has, similarly to the straightening plate 101 illustrated in FIG. 2, the channel plate 102 and the projections 103, and the projection 103 is formed on each of right: and left ends 104 of the channel plate 102 in FIG. 3. Each projection 103 is formed in parallel to the flowing direction of the mixed gas 33 in FIG. 4. FIG. 4 illustrates one projection 103 on the frontmost surface, and the other projection, not illustrated in FIG. 4, is positioned on the backmost surface.

The straightening mechanism 100 illustrated in FIG. 3 and FIG. 4 has the channel plate 102, the projection 103, and a portion 32a of the stage 32 opposite to the projection 103.

The straightening plate 101 forms the space 31 between the surface of the channel plate 102 and the surface of the base body 34, and is provided so that a shortest distance d1 between the surface of the channel plate 102 and the surface of the base body 34 in this space 31 is kept to be constant. The projections 103 are provided so that: a shortest distance (width) d2 of a gap 37 between the lower end of each of the projections 103 and the surface of the stage 32 is kept to be constant. As illustrated in FIG. 3, the space 31 and the gap 37 are continued with each other.

Such a straightening mechanism 100 illustrated in FIG. 3 and FIG. 4 straightens the mixed gas 33 supplied from an outside of the straightening mechanism 100.

In this case, the channel plate 102 and the projections 103 are provided so that d1>d2. These are more preferably provided so that d1/d2≥1.5, further preferably provided so that d1/d2≥2, and particularly preferably provided so that d1/d2≥3. An upper limit of d1/d2 is not particularly limited, and can be d1/d2≤6, for example. The d1 and d2 may be appropriately set according to the flowrate of the supplied mixed gas, but in the method for forming a film according to the present invention, increasing d1 typically tends to decrease an yield of the raw material. Thus, in more specific, d1 is preferably 0.5 mm to 5 mm, and d2 is preferably 0.1 mm to 3 mm.

When the shortest distance d1 is equal to or smaller than the width d2, a part of the mixed gas 33 flows outward through under the projections 103, or outside air flows in the flow of the mixed gas 33, which disturbs the flow of the mixed gas 33 to inhibit forming a uniform film and to cause adhesion of particles onto the surface to be film-formed to form defects.

The particles are fine particles formed by precipitating a solid content in the raw material mist or a powder further grown from these fine particles, or various particles contaminated from outside air. Examples of defects generated due to adhesion of the particles include dislocation and cracking generated by abnormally grown particles grown with the particles as nuclei.

The particle has approximately from sub-micron size to sub-millimeter size. A shape and number of the particles can be easily quantitatively evaluated by known technique, such as a detecting method in which a scattered light measurement of light radiated on a substrate and image recognition of the light-scattered position are combined, for example. For more convenience, the particle can also be evaluated as a bright spot in a dark field with an optical microscope.

The stage 32 and the base body 34 are preferably provided so that a difference (difference in height) "h" between an upper surface of the stage 32 and an upper surface of the base body 34 is 0 mm or longer and 1 mm or shorter. The difference "h" of 1 mm or shorter can sufficiently inhibit generation of turbulence due to the step between the stage 32 and the base body 34 to inhibit generation of the particles, and can sufficiently inhibit generation of distribution of the mist to prevent an increase in film thickness distribution.

Thus, on a portion 32d of the stage 32 on which the base body 34 is to be placed, a spot facing 32e can be provided so as to have a shape for receiving the base body 34 according to the thickness of the base body 34 and the film-forming condition to place the base body 34 in the spot facing 32e.

FIG. 3 and FIG. 4 illustrate the arrangement example in which the width d2 of the gap 37 is constituted with the projections 103 and the upper surface of the portion 32a of the stage 32, but the arrangement performed in the inventive method for forming a film is not limited thereto. The arrangement may be performed so that, as illustrated in FIG. 5 for example, a projection 32b is formed also on a part of the stage 32 and the gap 37 having the width d2 is formed between a part 103a of each of the side surfaces of the projections 103 each formed on a part of the straightening plate 101 and a part 32c of a side surface of the projection 32b of the stage 32. The sign "102" represents the channel plate, and the sign "34" represents the base body. The sign "31" represents the space formed between the base body 34 and the channel plate 102, and the shortest distance in this space between the base body 34 and the channel plate 102 is d1. The shortest distance d1 is larger than the width d2.

The straightening mechanism 100 illustrated in FIG. 5 has the projection 32b formed on a part of the stage 32 and a portion of the straightening plate 101 opposite this projection 32b. The straightening mechanism 100 illustrated. In FIG. 5 has the projections 103 each formed on a part of the straightening plate 101 and a portion of the stage 32 opposite to this projection 103.

The embodiment in which the projections constituting the straightening mechanism 100 is provided on the straightening plate 101 has been described above, but the arrangement performed in the inventive method for forming a film is not limited thereto, and as illustrated in FIG. 6 for example, arrangement in which the projection 32b is provided only on the stage 32 side may also be acceptable. In this embodiment case, the straightening plate 101 is constituted with only the channel plate 102. The sign "34" represents the base body. The sign "31" represents the space formed between the base body 34 and the channel plate 102, and the shortest distance in this space between the base body 34 and the channel plate 102 is d1.

The straightening mechanism 100 illustrated in FIG. 6 has the projection 32b formed on the stage 32 and a portion 101a of the straightening plate 101 (channel plate 102) opposite to this projection 32b, and the gap 37 having the width d2 therebetween. The width d2 is smaller than the shortest distance d1.

FIG. 7 is a view of the constitution in FIG. 6 viewed from the straightening plate 101 (channel plate 102) side. FIG. 7 illustrates, as an example, an embodiment of film-formation on the base body 34 with moving the stage 32 in the arrow direction. In this case, the projection 32b can be provided so that the projection 32b and the channel plate 102 retain the straightening mechanism 100 illustrated in FIG. 6 in an entirety of the movable region of the stage 32.

The film-forming apparatus that can be used in the method for forming a film according to the present invention can be variously modified.

For example, in FIG. 1, the mixed gas supplying unit 35 and the discharging unit 36 are provided separately from the straightening plate 101, but the film-forming apparatus that can be used in the inventive method for forming a film is not limited thereto. The mixed gas supplying unit 35 and/or the discharging unit 36 can be integrally constituted with the stage 32 and the straightening plate 101, for example.

FIG. 8 is a view illustrating one embodiment of the film-forming unit 30 in which the mixed gas supplying unit 35 and the discharging unit 36 are integrally constituted with the channel plate 102 described in FIG. 2 to FIG. 4. In the embodiment: in FIG. 8, the mixed gas 33 is ejected toward the stage direction through the ejecting port 35a connected with the channel plate 102 and formed into a flow in the horizontal direction by the straightening mechanism constituted with the channel plate 102 and the stage 32, and discharged through the discharging port 36a provided downward on the end of the channel plate in the flowing direction of the mixed gas 33.

Each of the connecting part between the straightening plate 101 (channel plate 102) and the ejecting port 35a and/or the connecting part between the straightening plate 101 (channel plate 102) and the discharging port 36a preferably has a curved surface. Such a curved surface enables the flow of the mixed gas 33 to be better.

In the embodiment in FIG. 8, the stage 32 is provided so as to keep the surface of the base body 34 on which a film is to be formed and the bottom of the mixed gas supplying unit 35 to be parallel to each other.

The structure, etc. of the stage 32 are not particularly limited, and may be any as long as they have sufficient stability according to characteristics of the raw material and the temperature condition. In this case, metals such as aluminum or stainless steel may be used. When the film-formation is performed at a high temperature exceeding a heat-resistant temperature of these metals or when an acidic or alkaline raw material is used, alloys such as Hastelloy, soda-lime glass, borosilicate glass, quartz, silicon carbide, or ceramics such as silicon nitride and aluminum nitride may be used.

Although not illustrated, the film-forming unit 30 may further have a known heater, such as a resistance heating heater and a lamp heater, to heat the base body 34. In this case, the heater can be incorporated in the stage 32, or may be provided outside the stage 32, for example. The stage 32 may have a mechanism for holding the base body 34. In this case, known base-body-holding methods such as a vacuum chuck, a mechanical clamp, and a statistic chuck can be applied. Within this range, the stage 32 may further have a rotating mechanism for the base body 34 to rotate in the horizontal direction.

The base body 34 is not particularly limited as long as it can support the film to be formed. A material of the base body 34 is also not particularly limited, and may be known materials, may be organic compounds, or may be inorganic compounds. Examples thereof include, but not limited to, polysulfone, polyether sulfone, polyphenylene sulfide, a polyether ether ketone, a polyimide, a polyetherimide, a fluororesin, metals such as iron, aluminum, stainless steel, and gold, silicon, sapphire, quartz, glass, calcium carbonate, lithium tantalate, lithium niobate, gallium oxide, SiC, ZnO, and GaN. Examples of a shape of the base body include a plate such as a plane plate and disk plate shapes, fibrous, bar, cylindrical, prismatic, column, helical, spherical, and ring shapes, and may be any of: them. In particular, when the base body has a plate shape, a base body having an area of 5 cm$^2$ or more, more preferably 10 cm$^2$ or more, and a thickness of 50 to 2000 μm, more preferably 100 to 800 μm, can be suitably used in the present invention, but not limited thereto.

In the inventive method for forming a film, the film-formation may be performed while the base body 34 and the straightening plate 101 being in a stationary state at a predetermined position where the base body 34 and the straightening plate 101 opposite to each other. Alternatively, the inventive method may have a moving unit (not illustrated) or a rotating unit (not illustrated) that car: change the relative position with the base body 34 in the horizontal direction. The inventive method having the moving unit or the rotating unit can yield better thickness distribution of the film to be formed, and can form a film on a large-diameter base body or a long-shaped base body.

The moving unit may be a mechanism for reciprocating motion in a horizontally uniaxial direction. The moving speed when moving in the uniaxial direction may be appropriately regulated according to the purpose, and is preferably 0.1 mm/s to 100 mm/s, and more preferably 1 mm/s or more and 30 mm/s or less. The moving speed of 1 mm/s or more can prevent the film-formation from being a rate-determining reaction to achieve a sufficient yield of the raw material and to be able to reduce opportunity of abnormal reactions. The moving speed of 100 mm/s or less enables the mixed gas 33 to sufficiently follow the moving motion to achieve excellent film-thickness distribution. A rotating speed when the rotation is performed is not particularly limited as long as it is within a range not generating turbulence of the mixed gas 33, and typically preferably performed at 1° per second to 18° per second.

The embodiment in FIG. 1 illustrates the embodiment in which the straightening plate 101 is provided above the stage 32, and a film-formation is performed while directing upward the surface to be film-formed of the base body 34. However, the film-forming apparatus used in the method for forming a film according to the present invention is not limited thereto, and may have a constitution in which the straightening plate 101 is provided below the stage 32, and a film-formation may be performed while directing downward the surface to be film-formed of the base body 34.

[Film-Forming Apparatus]

The film-forming apparatus of the representative example, which has been described above with reference to the drawings, is an example of the inventive film-forming apparatus.

That is, the film-forming apparatus 1 illustrated in FIG. 1 to FIG. 8 comprises: an atomizer 20 as an atomizing means that: atomizes a raw material solution 21 to form a raw material mist 22; a carrier gas supplying unit 10 as a supplying means for a carrier gas 11 for carrying the raw material mist 22; a stage 32 on which a base body 34 is to be placed; a mixed gas supplying unit 35 that supplies a mixed gas 23 which is a mixture of the raw material mist 22 and the carrier gas 11 to a surface of the base body 34; a channel plate 102 provided above the base body 34 so as to being opposite to the base body 34 via a space 31; a discharging unit 36 that discharges the mixed gas 33 in the space 31; and a projection 103 formed on a part of the channel plate 102 and/or a projection 32b formed on a part of the stage 32 so as to inhibit deviation of a flow of the mixed gas 33 from a direction from the mixed gas supplying unit 35 toward the discharging unit 36.

As illustrated in FIG. 3 to FIG. 6, the film-forming apparatus 1 has the channel plate 102 and the projection 103 and/or 32b provided so as to form a gap 37 having a width d2 smaller than a shortest distance d1 in a spate 31 between the channel plate 102 and the base body 34.

Film-formation and discharging with such a film-forming apparatus 1 can inhibit turbulence of the mixed gas 33 because of the aforementioned reason, which can manufacture a high-quality film with remarkably reduced surface deflects and adhesion of foreign matters with high productivity.

About details of examples of the film-forming apparatus, the above descriptions on FIG. 1 and FIG. 8 should be referred to.

In particular, in the film-forming apparatus 1, the channel plate 102, the projection 103 and/or 32b, and the stage 32 can constitute the straightening mechanism 100, as described above. Specifically, in the arrangement examples illustrated in FIG. 3 and FIG. 4, the straightening mechanism 100 has the channel plate 102, the projections 103, and the portion 32a of the stage 32 opposite to the projections 103 in the arrangement example illustrated in FIG. 5, the straightening mechanism 100 has the projection 32b formed on a part of the stage 32, the part of the straightening plate 101 (channel plate 102) opposite to this projection 32b, the projections 103 formed on a part of the straightening plate 101 (channel plate 102), and portions of the stage 32 opposite to these projections 103. In the arrangement example illustrated in FIG. 6, the straightening mechanism 100 has the projection 32b formed on the stage 32 and the portion 101a of the straightening plate 101 (channel plate 102) opposite to this projection 32b, and has the gap 37 having the width d2 therebetween.

The discharging unit 36 can be said to be connected with the straightening mechanism 100.

In the film-forming apparatus 1 illustrated in FIG. 1, the carrier gas supplying unit 10 as a carrier gas supplying means carries the carrier gas 11 through the carrier gas pipe 12 to the atomizer 20 as an atomizing means. In the film-forming apparatus 1 illustrated in FIG. 1, the mixed gas supplying unit 35 supplies the mixed gas 23 which is a mixture of the raw material mist 22 and the carrier gas 11 through the mist pipe 24 to the surface of the base body 34.

As illustrated in FIG. 3 to FIG. 6 and FIG. 8, on the portion 32d on which the base body 34 is to be placed of the stage 32, a spot facing 32e can be provided so as to have a shape for receiving the base body 34 according to the thickness of the base body 34 and the film-forming condition to place the base body 34 in the spot facing 32e Providing such a spot facing 32e can regulate a difference (difference in height) "h" between the upper surface of the stage 32 and the upper surface of the base body 34 to sufficiently inhibit generation of turbulence due to the step between the stage 32 and the base body 34, and to inhibit generation of particles, and can sufficiently inhibit generation of distribution of the mist to prevent an increase in film thickness distribution.

The channel plate 102 and the projection 103 and/or 32h are preferably provided so that the shortest distance d1 is 1.5 times or more larger than the width d2. The film-forming apparatus 1 having such arrangement can form a further high-quality film.

As described above, the channel plate and the projection are more preferably provided so that the shortest distance d1 is 2 times or more larger than the width d2, and particularly preferably provided so that the shortest distance d1 is 3 times or more larger than the width d2.

The projection 103 is preferably formed on a part of the channel plate 102.

Such a film-forming apparatus 1 can uniformly form a high-quality film more easily.

Alternatively, the projection 32b is preferably formed on a part of the stage 32.

Such a film-forming apparatus 1 can uniformly form a high-quality film more easily.

In another aspect, the film-forming apparatus 1 illustrated in FIG. 1 to FIG. 8 can be referred to as a film-forming system. The film-forming apparatus 1 illustrated in FIG. 1 to FIG. 8 as the film-forming system comprises: an atomizer 20 as a mechanism that atomizes a raw material solution 21 to form a raw material mist 22; a mechanism 40 (constituted with a carrier gas supplying unit 10 and the atomizer 20) for mixing the raw material mist 22 and a carrier gas 11 to form a mixed gas; a stage 32 on which a base body 34 is to be placed; a film-forming unit 30 as a mechanism for supplying the mixed gas 33 from the mixed gas supplying unit 35 to the base body 34, and forming a film can the base body 34; the discharging unit 36 as a mechanism for discharging a mixed gas 33 after the film-formation with the discharging unit 36; a channel plate 102 provided above the base body 34 so as to be opposite to the base body 34 via a space 31; and a projection 103 formed on a part of the channel plate 102 and/or a projection 32b formed on a part of the stage 32 so as to inhibit deviation of a flow of the mixed gas 33 from a direction from the mixed gas supplying unit 35 toward the discharging unit 36. The channel plate 102 and the projection 103 and/or 32h are provided so that a gap 37 having a width d2 smaller than a shortest distance d1 in the space 31 between the channel plate 102 and the base body 34 is formed. The film-forming system can include the film-forming apparatus 1 and the base body.

Alternatively, the film-forming apparatus 1 illustrated in FIG. 1 to FIG. 8 as the film-forming system can be said to comprise: an atomizer 20 as an atomizing means that atomizes a raw material solution 21 to form a raw material mist 22; a carrier gas supplying unit 10 as a supplying means of a carrier gas 11 that carries the raw material mist 22; a base body 34; a stage 32 on which a base body 34 is to be placed; a mixed gas supplying unit 35 that supplies a mixed gas 23 which is a mixture of the raw material mist 22 and the carrier gas 11 to the surface of the base body 34; a channel plate 102 provided above the base body 34 so as to be opposite to the base body 34 via a space 31; a discharging unit 36 that discharges the mixed gas 33 in the space 31; and a projection 103 formed on a part of the channel plate 102 and/or a projection 32b formed on a part of the stage 32 so as to inhibit deviation of a flow of the mixed gas 33 from a direction from the mixed gas supplying unit 35 toward the discharging unit 36, wherein the channel plate 102 and the projection 103 and/or 32b are provided so that a gap 37 having a width d2 smaller than a shortest distance d1 in the space 31 between the channel plate 102 and the base body 34 is formed.

[Laminate]

FIG. 9 illustrates a schematic cross-sectional view of an example of the inventive laminate.

A laminate 39 illustrated in FIG. 1 comprises: a base body 34; and an α-$Ga_2O_3$ film 38 directly or indirectly laminated on or above the base body 34.

A density of particles with 0.5 μm or more in diameter on a main surface of the laminate 39 is 9 or less per 10 $cm^2$.

Such a laminate 39 can have a high-quality α-$Ga_2O_3$ film 38 with reduced particle adhesion.

A smaller density of particles with 0.5 μm or more in diameter on the main surface of the laminate is better, but the density can be 1 or more per 10 $cm^2$ or more, for example.

The inventive laminate 39 can be obtained by inventive method for forming a film, for example.

The area of the main surface of the base body 34 can be 5 $cm^2$ or more.

The present invention can have a high-quality α-$Ga_2O_3$ film with reduced particle adhesion even when the area of the main surface of the base body 34 is 5 $cm^2$ or more.

An upper limit of the area of the main surface of the base body 34 is not particularly limited, but the area can be 900 $cm^2$ or less.

EXAMPLES

Hereinafter, the present invention will be specifically described by using Examples and Comparative Examples, but the present invention is not limited thereto.

Example 1

In the film-forming apparatus in FIG. 1, a straightening mechanism was provided as described with reference to FIG. 3 and FIG. 4, and a film-formation of α-gallium oxide was performed.

For a mixed gas supplying unit and a straightening plate (channel plate), those made of aluminum with alumite-treated surface were used. A hot plate made of SIC incorporating a resistance heating heater was used as a stage. Here, a shortest distance (width) d2 of a gap between a projection of the straightening plate and the stage was 2 mm, and a shortest distance d1 between the channel plate of the straightening plate and a surface of a substrate, described later, was 3 mm.

For supplying a carrier gas, a gas cylinder filled with nitrogen gas was used. The gas cylinder and the atomizer were connected with a tube made of a urethane resin, and the atomizer and a mixed gas supplying unit are connected with a pipe made of quartz.

As a raw material solution, into a diluted hydrochloric acid aqueous solution in which hydrochloric acid at a concentration of 34% was added at 1% at a volume ratio, gallium acetonato was dissolved at a proportion of 0.02 mol/L to prepare a mixture by stirring with a stirrer for 60 minutes, and this mixture was loaded into the atomizer. The used atomizer had two ultrasonic-wave vibration plates (frequency: 2.4 MHz).

Then, a c-face sapphire substrate with 0.65 mm in thickness and 4 inch (approximately 10 cm) in diameter was placed on the stage and heated so that the substrate temperature was 400° C. In this time, a difference in height between the upper surface of the stage and the substrate surface was 0.2 mm.

Then, ultrasonic wave vibration was propagated with the ultrasonic-wave vibration plates through water to a precursor in the atomizer: to atomize (atomize into a mist of) the raw material solution.

Then, nitrogen gas was added into a raw material container at a flowrate of 25 L/min to supply a mixed gas of the mist and the nitrogen gas to a mixed gas supplying unit, and discharging was performed at a discharging flowrate of 28 L/min. During this time, the stage was horizontally moved so that an ejecting port of the mixed gas supplying unit was uniformly passed above the substrate, and a film-formation was performed for 60 minutes.

The supply of the nitrogen gas was stopped immediately thereafter to stop the supply of the mixed gas to the mixed gas supplying unit.

A crystal layer of the produced laminate was conformed to be α-phase $Ga_2O_3$ because a peak appeared at 2θ=40.3° by an X-ray diffraction measurement.

Thereafter, a thickness of the produced film was measured at 25 points in the surface thereof by optical reflectance analysis. Specified as film-thickness distribution was a value obtained by dividing a difference between a maximum value and minimum value of the measurement values by a doubled average value thereof. A density of particles (with 0.5 μm or more in diameter) on the film was evaluated with a substrate inspecting apparatus (KLA candela-CS10). Furthermore, crystal orientation of the film was evaluated with a rocking-curve full width at half maximum of XRD (Rigaku Smart-Lab).

Example 2

An α-gallium oxide film was formed in the same manner as in Example 1 except that, in the arrangement of the straightening mechanism illustrated in FIG. 3 and FIG. 4, the shortest distance d1 was 3 mm and the width d2 was 0.5 mm.

A crystal layer of the produced laminate was conformed to be α-phase $Ga_2O_3$ because a peak appeared at 2θ=40.3° by an X-ray diffraction measurement.

Thereafter, the film was evaluated in the same manner as in Example 1.

Comparative Example 1

An α-gallium oxide film was formed in the same manner as in Example 1 except that, in the arrangement of the straightening mechanism illustrated in FIG. 3 and FIG. 4, the shortest distance d1 was 3 mm and the width d2 was 0.3 mm.

A crystal layer of the produced laminate was conformed to be α-phase $Ga_2O_3$ because a peak appeared at 2θ=40.3° by an X-ray diffraction measurement.

Thereafter, the film was evaluated in the same manner as in Example 1.

Example 3

An α-gallium oxide film was formed in the same manner as in Example 1 except that, in the film-forming apparatus in FIG. 1, the straightening mechanism was provided as described with reference to FIG. 5 in this time, the difference in height between the upper surface of the stage and the substrate surface was 0.2 mm.

A crystal layer of the produced laminate was conformed to be α-phase $Ga_2O_3$ because a peak appeared at 2θ=40.3° by an X-ray diffraction measurement.

Thereafter, the film was evaluated in the same manner as in Example 1.

Comparative Example 2

An α-gallium oxide film was formed in the same manner as in Example 3 except that, in the arrangement of the straightening mechanism illustrated in FIG. 5, the shortest distance d1 was 3 mm and the width d2 was 3 mm.

A crystal layer of the produced laminate was conformed to be α-phase $Ga_2O_3$ because a peak appeared at 2θ=40.3° by an X-ray diffraction measurement.

Thereafter, the film was evaluated in the same manner as in Example 1.

Comparative Example 3

An α-gallium oxide film was formed in the same manner as in Example 3 except that, in the arrangement of the straightening mechanism illustrated in FIG. 5, the shortest distance d1 was 3 mm and the width d2 was 3 mm, and the difference in height between the upper surface of the stage and the substrate surface was 1.2 mm.

TABLE 1

| | d1/d2 | b [mm] | Film-thickness distribution [%] | Particle density [per $cm^2$] | Particle density [per 10 $cm^2$] | Rocking-curve full width at half maximum [sec] |
|---|---|---|---|---|---|---|
| Example 1 | 1.5 | 0.2 | 3.2 | <1 | 8.7 | 11.4 |
| Example 2 | 6.0 | 0.2 | 3.0 | <1 | 7.6 | 10.8 |
| Comparative Example 1 | 1.0 | 0.2 | 25.5 | 77 | 770 | 44.2 |
| Example 3 | 1.5 | 0.2 | 3.0 | <1 | 8.1 | 11.0 |
| Comparative Example 2 | 1.0 | 0.2 | 27.3 | 61 | 610 | 44.2 |
| Comparative Example 3 | 1.0 | 1.2 | 37.2 | 185 | 1850 | 44.0 |

Table 1 shows the evaluation results of Examples 1 to 3 and Comparative Examples 1 to 3. The formed films were α-$Ga_2O_3$ in all the cases, but the results of Examples 1 to 3 demonstrated improved film thickness distribution and rocking-curve full width at half maximum, and a remarkably reduced particle density, compared with Comparative Examples 1 to 3.

From the above results, it has been found that the present invention can be a method for forming a film that can produce a high-quality uniform film compared with conventional art.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for forming a film, comprising steps of:
    atomizing a raw material solution to form a raw material mist;
    mixing the raw material mist and a carrier gas to form a mixed gas;
    placing a base body on a stage;
    supplying the mixed gas from a mixed gas supplying unit to the base body, and performing film-formation on the base body; and
    discharging a mixed gas after the film-formation by a discharging unit, wherein
    in the step of performing the film-forming on the base body and in the step of discharging by the discharging unit,
    a channel plate is provided above the base body so that the channel plate is opposite to the base body via a space,
    a mixed gas flow linearly flowing from the mixed gas supplying unit toward the discharging unit is formed so that the mixed gas through the space above the base body is along at least a part of a main surface of the base body,
    a projection is formed on a part of the channel plate and/or a part of the stage so as to inhibit deviation of the mixed gas flow from a direction from the mixed gas supplying unit toward the discharging unit, and
    the channel plate and the projection are provided so that a gap having a width d2 smaller than a shortest distance d1 in the space between the channel plate and the base body is formed, and the film-formation and the discharging are performed.

2. The method for forming a film according to claim 1, wherein the step of placing the base body on the stage is performed so that a difference in height between an upper surface of the stage and an upper surface of the base body is 1 mm or less.

3. The method for forming a film according to claim 1, wherein the channel plate and the projection are provided so that the shortest distance d1 is 1.5 times or more larger than the width d2.

4. The method for forming a film according to claim 1, wherein the channel plate and the projection are provided so that the shortest distance d1 is 2 times or more larger than the width d2.

5. The method for forming a film according to claim 1, wherein the projection is formed on a part of the channel plate.

6. The method for forming a film according to claim 1, wherein the projection is formed on a part of the stage.

7. A film-forming apparatus, comprising:
    an atomizer that atomizes a raw material solution to form a raw material mist;
    a supplying unit for a carrier gas which is to carry the raw material mist;
    a stage on which a base body is to be placed;
    a mixed gas supplying unit that supplies a mixed gas which is a mixture of the raw material mist and the carrier gas to a surface of the base body;
    a channel plate provided above the base body so that the channel plate is opposite to the base body via a space;

a discharging unit that discharges the mixed gas in the space; and a projection formed on a part of the channel plate and/or a part of the stage so as to inhibit deviation of a flow of the mixed gas from a direction from the mixed gas supplying unit toward the discharging unit, wherein the channel plate and the projection are provided so that a gap having a width d2 smaller than a shortest distance d1 in the space between the channel plate and the base body is formed.

8. The film-forming apparatus according to claim 7, wherein the stage has a spot facing for receiving the base body with a portion on which the base body is to be placed.

9. The film-forming apparatus according to claim 7, wherein the channel plate and the projection are provided so that the shortest distance d1 is 1.5 times or more larger than the width d2.

10. The film-forming apparatus according to claim 7, wherein the channel plate and the projection are provided so that the shortest distance d1 is 2 times or more larger than the width d2.

11. The film-forming apparatus according to claim 7, wherein the projection is formed on a part of the channel plate.

12. The film-forming apparatus according to claim 7, wherein the projection is formed on a part of the stage.

* * * * *